United States Patent
Yoon (10) Patent No.: US 8,059,477 B2
(45) Date of Patent: Nov. 15, 2011

(54) REDUNDANCY CIRCUIT OF SEMICONDUCTOR MEMORY

(75) Inventor: Sang Sic Yoon, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 84 days.

(21) Appl. No.: 12/650,710

(22) Filed: Dec. 31, 2009

(65) Prior Publication Data

US 2011/0026338 A1 Feb. 3, 2011

(30) Foreign Application Priority Data

Jul. 31, 2009 (KR) .................. 10-2009-0070781

(51) Int. Cl.
*G11C 29/00* (2006.01)

(52) U.S. Cl. .................. 365/200; 365/120; 365/230.01; 365/191; 365/225.7; 365/189.07

(58) Field of Classification Search ............... 365/225.7, 365/200, 189.07, 191, 120, 230.01
See application file for complete search history.

(56) References Cited

U.S. PATENT DOCUMENTS

| | | | |
|---|---|---|---|
| 6,570,804 B1 | 5/2003 | Blodgett | |
| 6,950,351 B2 | 9/2005 | Lim | |
| 6,977,851 B2 | 12/2005 | Noguchi | |
| 7,397,715 B2 | 7/2008 | Lim et al. | |
| 2006/0092725 A1* | 5/2006 | Min et al. .................. 365/200 |

FOREIGN PATENT DOCUMENTS

| | | |
|---|---|---|
| JP | 08-077790 | 3/1996 |
| KR | 10-0630527 | 9/2006 |
| KR | 1020070069367 A | 7/2007 |

* cited by examiner

*Primary Examiner* — Thong Q Le (74) *Attorney, Agent, or Firm* — William Park & Associates Ltd.

(57) ABSTRACT

A redundancy circuit of a semiconductor memory apparatus includes an enable signal generation unit configured to have a plurality of enable fuses corresponding to a first mat grouping information signal and a second mat grouping information signal and enable an enable signal when at least one of the plurality of enable fuses is cut and a mat grouping information signal corresponding to the cut fuse is inputted; a fail address setting control block configured to select the first mat grouping information signal or the second mat grouping information signal depending upon whether an enable fuse corresponding to the first mat grouping information signal is cut or not, and generate fail setting addresses; and a comparison section configured to compare the fail setting addresses with real addresses and generate a redundancy address.

19 Claims, 4 Drawing Sheets

REDUNDANCY CIRCUIT OF SEMICONDUCTOR MEMORY

CROSS-REFERENCE TO RELATED APPLICATION

The present application claims priority under 35 U.S.C. §119(a) to Korean Application No. 10-2009-0070781, filed on Jul. 31, 2009, in the Korean Intellectual Property Office, which is incorporated herein by reference in its entirety as if set forth in full.

BACKGROUND OF THE INVENTION

1. Technical Field

Various embodiments of the present disclosure generally relate to a semiconductor memory apparatus, and more particularly, to a redundancy circuit of a semiconductor memory apparatus.

2. Related Art

Figure 1:
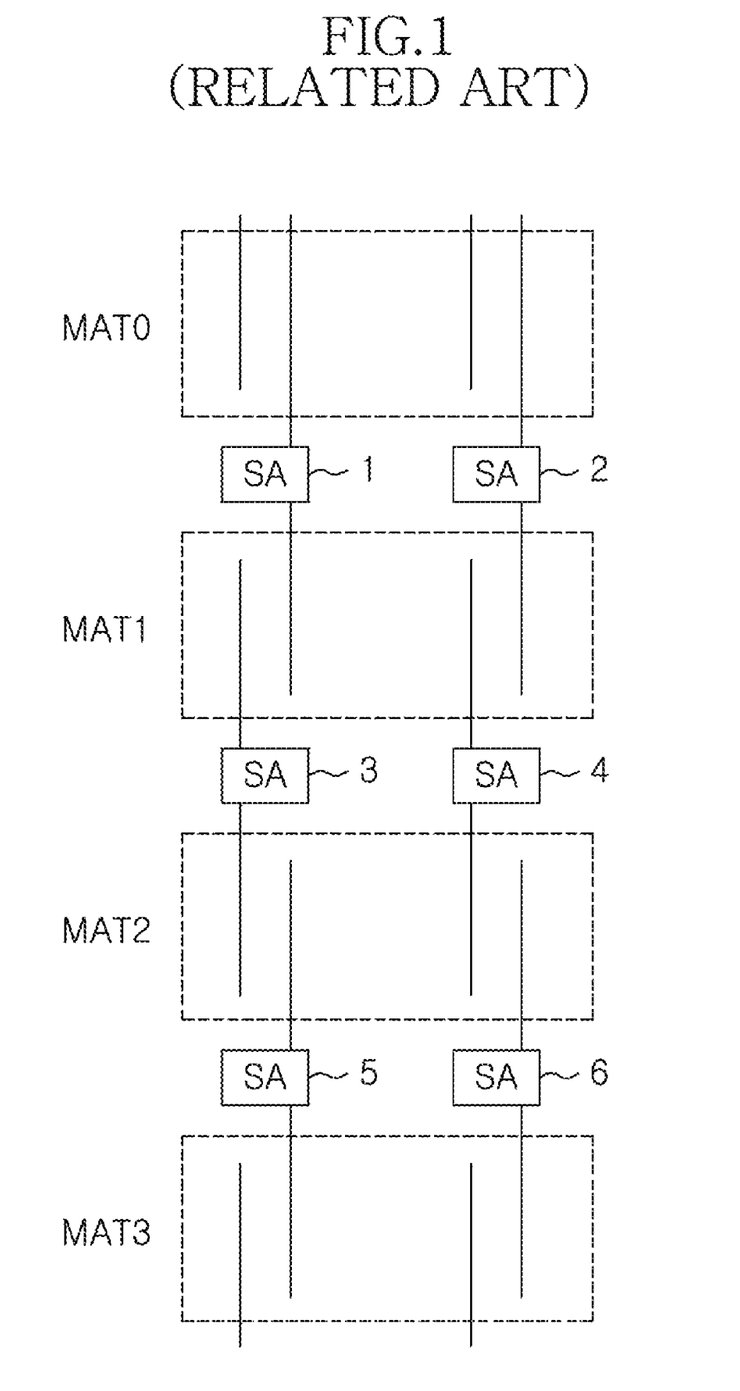
FIG. 1 is a diagram schematically illustrating a typical open bit line sense amplifier structure.

FIG. 1 is a diagram schematically illustrating a typical open bit line sense amplifier structure. In an open bit line sense amplifier structure of the semiconductor memory apparatus, respective sense amplifiers are shared by adjoining mats as shown in FIG. 1.

Briefly describing an operation of the open bit line sense amplifier structure, when data from a second mat MAT1 is outputted, a sense amplifier 3 is activated such that the voltage level of a bit line connected to the second mat MAT1 is amplified relative to a bit line connected to a third mat MAT2. Through such an operation, the semiconductor memory apparatus having the open bit line sense amplifier structure carries out the task of reading data from the second mat MAT1.

In the semiconductor memory apparatus having the open bit line sense amplifier structure, if any of the respective mats MAT0 through MAT3 fails to perform storing data, the failed mat, that is, the mat in which a memory cell failure occurs during a test is replaced with a redundant mat by a redundancy circuit.

The redundancy circuit of the open bit line sense amplifier structure is configured in such a manner that, for example, if a to memory cell failure occurs in one of the first mat MAT0 and the second mat MAT1, the failed mat is replaced with a redundant mat. In a similar manner, if a memory cell failure occurs in one of the third mat MAT2 and the fourth mat MAT3, the failed mat is replaced with a redundant mat.

Specifically, typical redundancy circuit of the open bit line sense amplifier structure is configured such that information of two adjoining mats is received through a single fuse and an address of the failed memory cell is set. If a real address inputted externally to the semiconductor memory apparatus corresponds to an address of the failed memory cell, a redundancy signal is enabled. If the redundancy signal is enabled, the failed mat is replaced with a redundant mat.

In the typical redundancy circuit of the open bit line sense amplifier structure, if a memory cell failure occurs in the third mat MAT2 connected to the sense amplifier 3, both a fuse for receiving the information of the first mat MAT0 and the second mat MAT1 and setting an address of the failed memory cell and a fuse for receiving the information of the third mat MAT2 and the fourth mat MAT3 and setting an address of the failed memory cell should be determined to be cut or not according to an address of the failed memory cell, thereby causing difficulties. This is because of the open bit line sense amplifier structure in which the sense amplifier 3 should amplify the data of the second mat MAT1 relative to a bit line connected to the third mat MAT2 which has a reference voltage level.

As a result, the typical redundancy circuit of the open bit line sense amplifier structure has a defect in that a number of fuses should be cut to replace the failed mat with a redundant mat, causing fuse utilization efficiency to deteriorate.

SUMMARY OF THE INVENTION

Various aspects of the present invention comprise a redundancy circuit of a semiconductor memory apparatus which increases fuse utilization efficiency.

In one aspect of the present invention, a redundancy circuit of a semiconductor memory apparatus comprises an enable signal generation unit configured to have a plurality of enable fuses corresponding to a first mat grouping information signal and a second mat grouping information signal and enable an enable signal when at least one of the plurality of enable fuses is cut and a mat grouping information signal corresponding to the cut fuse is inputted; a fail address setting control block configured to select the first mat grouping information signal or the second mat grouping information signal depending on whether an enable fuse corresponding to the first mat grouping information signal is cut, and generate fail setting addresses; and a comparison section configured to compare the fail setting addresses with real addresses and generate a redundancy address.

In another aspect of the present invention, a redundancy circuit of a semiconductor memory apparatus comprises an enable signal generation unit configured to generate a first fuse enable signal when a first fuse corresponding to a first mat grouping information signal is cut, generate a second fuse enable signal when a second fuse corresponding to a second mat grouping information signal is cut, and generate an enable signal when any one of the first fuse enable signal and the second fuse enable signal is enabled; a selection unit configured to selectively output the first mat grouping information signal and the second mat grouping information signal as mat information signals in response to the first fuse enable signal; a fail address setting unit configured to generate fail setting addresses in response to the mat information signals and fuse cutting; and a comparison section configured to compare the fail setting addresses with real addresses when the enable signal is enabled, and generate a redundancy address.

In another aspect of the present invention, a redundancy circuit of a semiconductor memory apparatus comprises an enable signal generation unit configured to have a first fuse and a second fuse respectively corresponding to a first group mat signal and a second group mat signal and enable a first fuse enable signal when the first fuse or the second fuse is cut and a group mat signal corresponding to the cut fuse is inputted, to have a third fuse and a fourth fuse respectively corresponding to a third group mat signal and a fourth group mat signal and enable a second fuse enable signal when the third fuse or the fourth fuse is cut and a group mat signal corresponding to the cut fuse is inputted, and to enable an enable signal when any one of the first and second fuse enable signals is enabled; a selection unit configured to selectively output the first group mat signal and the second group mat signal as a first mat information signal or the third group mat signal and the fourth group mat signal as a second mat information signal, in response to the first fuse enable signal; a fail address setting unit configured to have a fifth fuse and a sixth fuse respectively corresponding to the first and second mat grouping information signals, and generate fail setting addresses of specified voltage levels when the fifth fuse or the sixth fuse is cut and a mat information signal corresponding to the cut fuse is inputted; and a comparison section configured to generate a redundancy address when the enable signal is enabled and voltage levels of the fail setting addresses and real addresses are the same.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
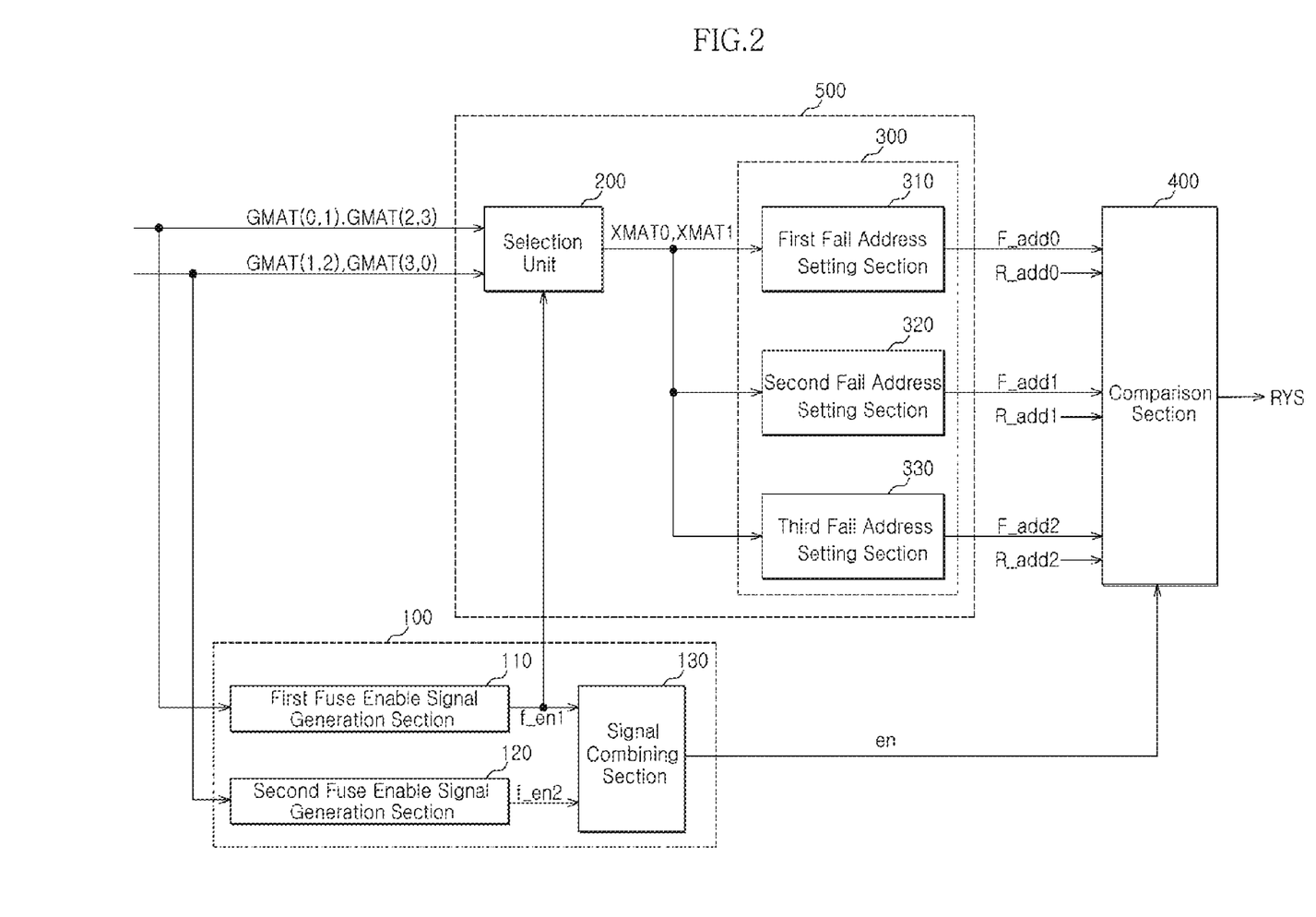
FIG. 2 is a schematic diagram illustrating a redundancy circuit of a semiconductor memory apparatus in accordance with one embodiment of the present invention.

FIG. 2 is a schematic diagram illustrating a redundancy circuit of a semiconductor memory apparatus in accordance with one embodiment of the present invention. Referring to FIG. 2, the redundancy circuit comprises an enable signal generation unit 100, a selection unit 200, a fail address setting unit 300, and a comparison section 400.

The present invention is described based on, but is not limited to, a semiconductor memory apparatus having first through fourth mats MAT0 through MAT3 as shown in FIG. 1. It is to be understood that other types of apparatus may also be used. A first group mat signal GMAT(0,1) may be a signal that is enabled when either the first mat MAT0 or the second mat MAT1 is activated. A second group mat signal GMAT(2,3) may be a signal that is enabled when either the third mat MAT2 or the fourth mat MAT3 is activated. A third group mat signal GMAT(1,2) may be a signal that is enabled when either the second mat MAT1 or the third mat MAT2 is activated. A fourth group mat signal GMAT(3,0) may be a signal that is enabled when either the fourth mat MAT3 or the first mat MAT0 is activated. Also, a first mat grouping information signal GMAT(0,1) and GMAT(2,3) may comprise the first group mat signal GMAT(0,1) and the second group mat signal GMAT(2,3), and a second mat grouping information signal GMAT(1,2) and GMAT(3,0) may comprise the third group mat signal GMAT(1,2) and the fourth group mat signal GMAT(3,0).

The enable signal generation unit 100 may comprise a plurality of enable fuses (shown in FIG. 3) which correspond to the first mat grouping information signal GMAT(0,1) and GMAT(2,3) and the second mat grouping information signal GMAT(1,2) and GMAT(3,0). If at least one of the plurality of enable fuses is cut and a mat grouping information signal corresponding to the cut fuse is inputted, the enable signal generation unit 100 may enable an enable signal en (shown in FIG. 6).

The enable signal generation unit 100 may comprise a first fuse enable signal generation section 110, a second fuse enable signal generation section 120, and a signal combining section 130.

The first fuse enable signal generation section 110 enables a first fuse enable signal f_en1 when an enable fuse corresponding to the first mat grouping information signal GMAT (0,1) and GMAT(2,3) is cut and the first mat grouping information signal GMAT(0,1) and GMAT(2,3) is inputted.

The second fuse enable signal generation section 120 enables a second fuse enable signal f_en2 when an enable fuse corresponding to the second mat grouping information signal GMAT(1,2) and GMAT(3,0) is cut and the second mat grouping information signal GMAT(1,2) and GMAT(3,0) is inputted.

The signal combining section 130 enables the enable signal en when one of the first fuse enable signal f_en1 and the second fuse enable signal f_en2 is enabled. The signal combining section 130 may be configured to receive and OR the first and second fuse enable signals f_en1 and f_en2 and generate the enable signal en.

A fail address setting control block 500 having the selection unit 200 and the fail address setting unit 300 may be configured to select the first mat grouping information signal GMAT(0,1) and GMAT(2,3) or the second mat grouping information signal GMAT(1,2) and GMAT(3,0) in response to whether a fuse corresponding to the first mat grouping information signal GMAT(0,1) and GMAT(2,3) is cut, and to generate first through third fail setting addresses F_add0 through F_add2.

The selection unit 200 selectively outputs the first mat grouping information signal GMAT(0,1) and GMAT(2,3) as a first mat information signal XMAT0 or the second mat grouping information is signal GMAT(1,2) and GMAT(3,0) as a second mat information signal XMAT1, in response to the first fuse enable signal f_en1.

The fail address setting unit 300 comprises first through third fail address setting sections 310 through 330.

The first fail address setting section 310 has a plurality of setting fuses (shown in FIG. 5) corresponding to the first and second mat information signals XMAT0 and XMAT1. If at least one of the plurality of fuses is cut and a mat information signal corresponding to the cut fuse is inputted, the first fail address setting section 310 generates a first fail setting address F_add0 of a specified voltage level.

The second fail address setting section 320 has a plurality of setting fuses (not shown) corresponding to the first and second mat information signals XMAT0 and XMAT1. If at least one of the plurality of fuses is cut and a mat information signal corresponding to the cut fuse is inputted, the second fail address setting section 320 generates a second fail setting address F_add1 of a specified voltage level.

The third fail address setting section 330 has a plurality of setting fuses (not shown) corresponding to the first and second mat information signals XMAT0 and XMAT1. If at least one of the plurality of fuses is cut and a mat information signal corresponding to the cut fuse is inputted, the third fail address setting section 330 generates a third fail setting address F_add2 of a specified voltage level.

If the enable signal en is enabled, the comparison section 400 compares the first through third fail setting addresses F_add0 through F_add2 with first through third real addresses R_add0 through R_add2, respectively, and generates a redundancy address RYS.

Figure 3:
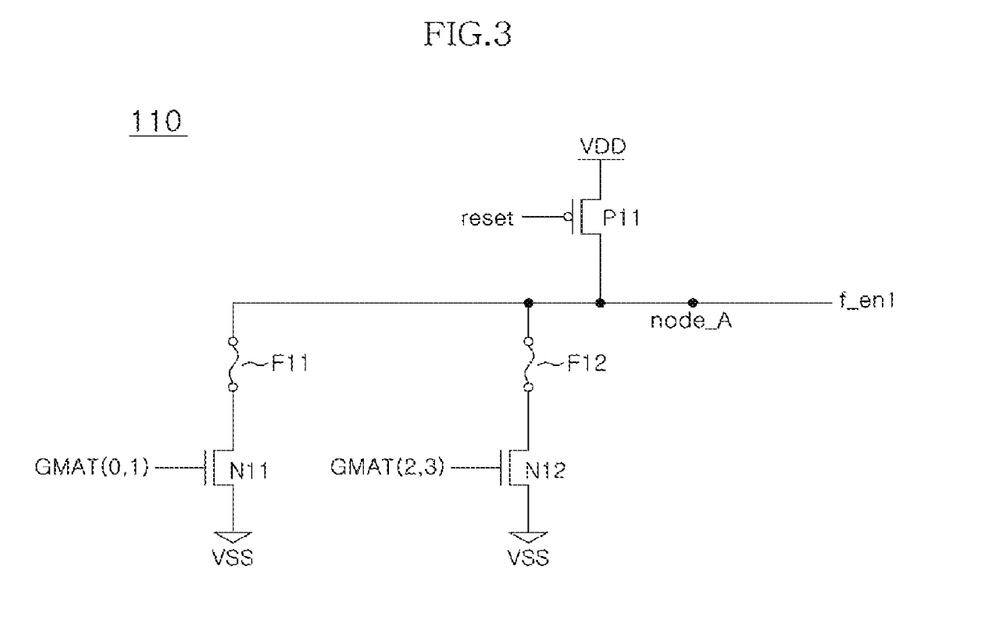
FIG. 3 is a diagram illustrating a first fuse enable signal generation section as shown in FIG. 2.

FIG. 3 is a diagram illustrating a first fuse enable signal generation section 110 as shown in FIG. 2. The first fuse enable signal generation section 110 comprises a first enable fuse F11 and a second enable fuse F12 which respectively correspond to the first group mat signal GMAT(0,1) and the second group mat signal GMAT(2,3). If the first enable fuse F11 or the second enable fuse F12 is cut, when a group mat signal corresponding to the cut fuse is inputted, the first fuse enable signal generation section 110 enables the first fuse enable signal f_en1.

The second fuse enable signal generation section 120 in FIG. 2 may have an internal configuration as the first fuse enable signal generation section 110 as described above, except for the input signals GMAT(1,2) and GMAT(3,0) and the output signal f_en2.

Referring to FIG. 3, the first fuse enable signal generation section 110 may comprise first through third transistors P11, N11 and N12, the first enable fuse F11, and the second enable fuse F12.

The first transistor P11 applies an external voltage VDD to an output node node_A if a reset signal reset is enabled at the gate thereof. Thus, the first transistor P11 serves as a switch for applying the external voltage VDD to the output node node_A in response to the reset signal reset. At this time, the voltage level of the output node node_A becomes the voltage level of the first fuse enable signal f_en1.

The first enable fuse F11 has one terminal to which the output node node_A is connected. The second transistor N11 has a gate which receives the first group mat signal GMAT(0,1), a drain to which the other terminal of the first enable fuse F11 is connected, and a source which is connected to a ground terminal VSS. Since the second transistor N11 can lower the voltage level of the output node node_A depending upon whether the first enable fuse F11 is cut or not, the first enable fuse F11 and the second transistor N11 may be called a fuse switching part.

The second enable fuse F12 has one terminal to which the output node node_A is connected. The third transistor N12 has a gate which receives the second group mat signal GMAT(2,3), a drain to which the other terminal of the second enable fuse F12 is connected, and a source which is connected to the ground terminal VSS. The second enable fuse F12 and the third transistor N12 may also be called a fuse switching part.

The selection unit 200 selectively outputs the first group mat signal GMAT(0,1) or the third group mat signal GMAT(1,2) as the first mat information signal XMAT0 in response to the first fuse enable signal f_en1. Also, the selection unit 200 selectively outputs the second group mat signal GMAT(2,3) or the fourth group mat signal GMAT(3,0) as the second mat information signal XMAT1 in response to the first fuse enable signal f_en1.

Figure 4:
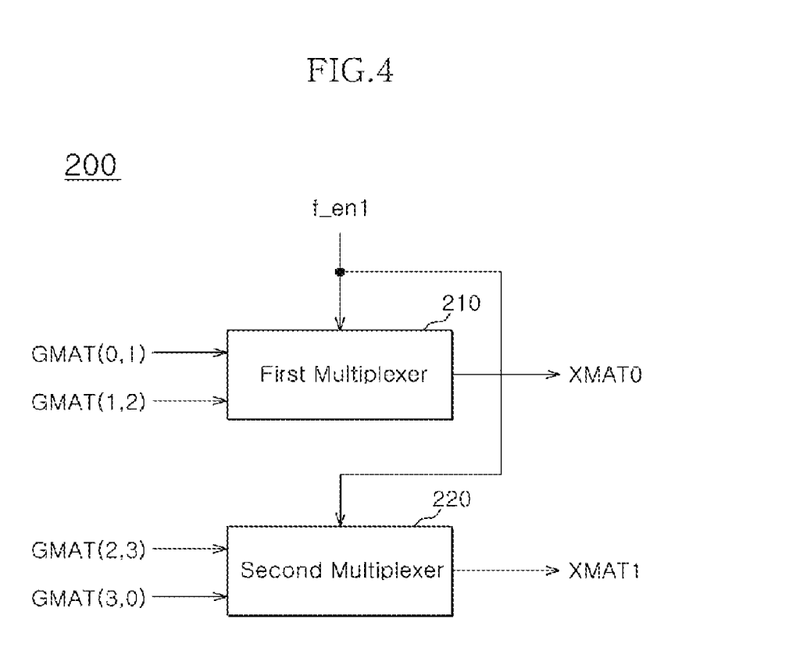
FIG. 4 is a diagram of a selection unit as shown in FIG. 2.

FIG. 4 is a diagram of the selection unit 200 as shown in FIG. 2. Referring to FIG. 4, the selection unit 200 may comprise first and second multiplexers 210 and 220.

The first multiplexer 210 selectively outputs the first group mat signal GMAT(0,1) or the third group mat signal GMAT(1,2) as the first mat information signal XMAT0 in response to the first fuse enable signal f_en1.

The second multiplexer 220 selectively outputs the second group mat signal GMAT(2,3) or the fourth group mat signal GMAT(3,0) as the second mat information signal XMAT1 in response to the first fuse enable signal f_en1.

The first through third fail address setting sections 310 through 330 may be configured in a similar manner with the same input signals XMAT0 and XMAT1 as described above, except for the output signals F_add0, F_add1 and F_add2.

Figure 5:
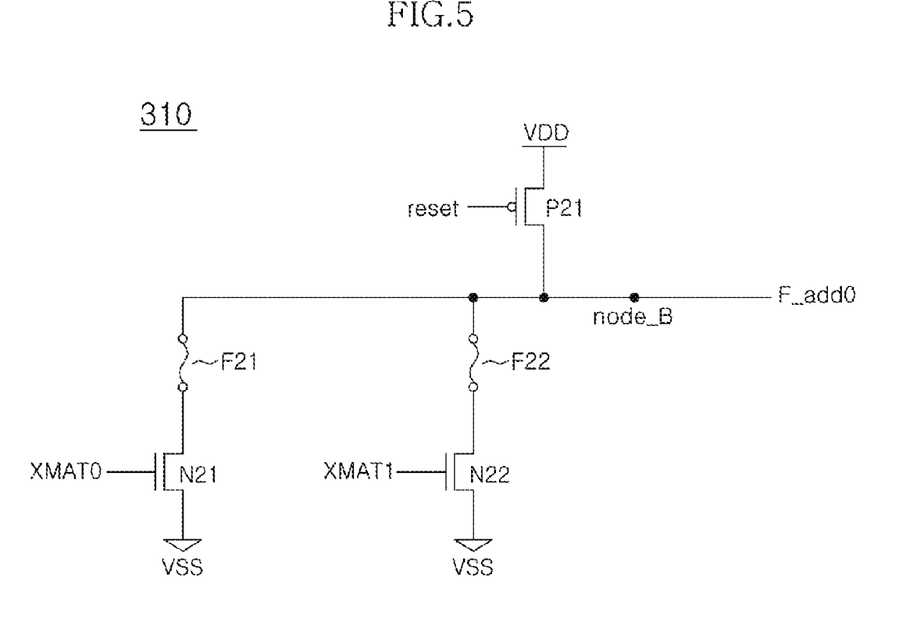
FIG. 5 is a diagram of a first fail address setting section as shown in FIG. 2.

FIG. 5 is a diagram of a first fail address setting section 310 as shown in FIG. 2. Referring to FIG. 5, the first fail address setting section 310 may comprise fourth through sixth transistors P21, N21 and N22, a first setting fuse F21, and a second setting fuse F22.

The fourth transistor P21 applies the external voltage VDD to an output node node_B if the reset signal reset is enabled at a gate thereof. Thus, the fourth transistor P21 serves as a switch for applying the external voltage VDD to the output node node_B in response to the reset signal reset. At this time, the voltage level of the output node node_B becomes the voltage level of the first fail setting address F_add0.

The first setting fuse F21 has one terminal to which the output node node_B is connected. The fifth transistor N21 has a gate which receives the first mat information signal XMAT0, a drain to which the other terminal of the first setting fuse F21 is connected, and a source which is connected to the ground terminal VSS. Since the fifth transistor N21 can lower the voltage level of the output node node_B depending upon whether the first setting fuse F21 is cut or not, the setting fuse F21 and the fifth transistor N21 may be called a fuse switching part.

The second setting fuse F22 has one terminal to which the output node node_B is connected. The sixth transistor N22 has a gate which receives the second mat information signal XMAT1, a drain to which the other terminal of the second setting fuse F22 is connected, and a source which is connected to the ground terminal VSS. The second setting fuse F22 and the sixth transistor N22 may also be called a fuse switching part.

In the state in which the enable signal en is enabled, if the voltage levels of the first fail setting address F_add0 and the first real address R_add0 are the same, the voltage levels of the second fail setting address F_add1 and the second real address R_add1 are the same and the voltage levels of the third fail setting address F_add2 and the third real address R_add2 are the same, the comparison section 400 may generate the redundancy address RYS.

Figure 6:
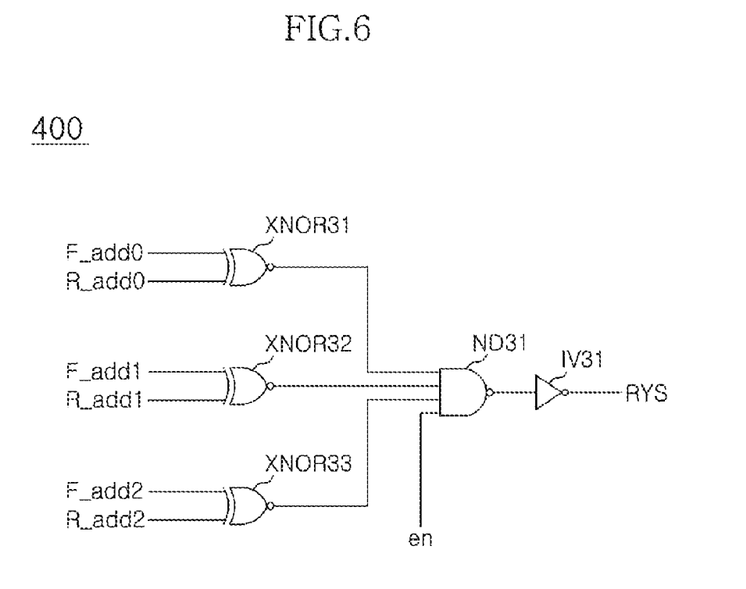
FIG. 6 is a diagram of a comparison section as shown in FIG. 2.

FIG. 6 is a diagram of a comparison section as shown in FIG. 2. Referring to FIG. 6, the comparison section 400 comprises first through third exclusive NOR gates XNOR31 through XNOR33, a NAND gate ND31, and an inverter IV31.

The first exclusive NOR gate XNOR31 receives the first fail setting address F_add0 and the first real address R_add0. The second exclusive NOR gate XNOR32 receives the second fail setting address F_add1 and the second real address R_add1. The third exclusive NOR gate XNOR33 receives the third fail setting address F_add2 and the third real address R_add2. The NAND gate ND31 receives the output signals of the first through third exclusive NOR gates XNOR31 through XNOR33 and the enable signal en. The inverter IV31 receives the output signal of the NAND gate ND31 and outputs the redundancy address RYS.

As shown in FIG. 1, it is assumed that the open bit line structure of a semiconductor memory apparatus comprises first through fourth mats MAT0 through MAT3.

In a typical semiconductor memory apparatus, if a memory cell failure occurs in the third mat MAT2 connected to the sense amplifier 3, both a fuse for receiving information of the first mat MAT0 and the second mat MAT1 and setting an address of the failed memory cell and a fuse for receiving information of the third mat MAT2 and the fourth mat MAT3 and setting an address of the failed memory cell should be determined to be cut or not according to an address of the failed memory cell.

However, in the redundancy circuit of the semiconductor memory apparatus according to one embodiment of the present invention, it is only necessary to determine whether to cut a fuse for receiving the information of the second mat MAT1 and the third mat MAT2 connected to the sense amplifier 3 and setting an address of the failed memory cell. As a consequence, in the embodiment of the present invention, fuse utilization efficiency is improved and the number of fuses necessary to implement the redundancy circuit may be reduced, whereby areal efficiency of the semiconductor memory apparatus is improved.

Exemplary operations of the redundancy circuit of a semiconductor memory apparatus according to one embodiment of the present invention that achieves these advantages are described below.

First, as described above, if a memory cell failure occurs in the third mat MAT2 connected to the sense amplifier 3, the second mat MAT1 and the third mat MAT2 may be replaced with redundant mats. This is because the sense amplifier 3 is connected to both the second mat MAT1 and the third mat MAT2. Therefore, in the configuration of the second fuse enable signal generation section 120, a fuse corresponding to the third group mat signal GMAT(1,2) is cut.

Also, since the addresses should be set in the second failed mat MAT1 and the third failed mat MAT2, in the configurations of the first through third fail address setting sections 310, 320 and 330, whether to cut a fuse corresponding to the first mat information signal XMAT0 is determined based on the value of an address of the failed memory cell. For example, in FIG. 5, assuming that the first fail setting address F_add0 regarding the first mat information signal XMAT0 has a high level, the first setting fuse F21 is cut. If the first fail setting address F_add0 has a low level, the first setting fuse F21 is not cut.

Below are exemplary operations of the redundancy circuit of a semiconductor memory apparatus after fuse cutting is implemented, according to one embodiment of the present invention.

If the third mat MAT2 is activated, the third group mat signal GMAT(1,2) and the second group mat signal GMAT(2,3) may be enabled.

Though the enabled second group mat signal GMAT(2,3) is inputted to the first fuse enable signal generation section 110 and the fuse corresponding to the second group mat signal GMAT(2,3) is not cut, the first fuse enable signal f_en1 is disabled.

When the enabled third group mat signal GMAT(1,2) is inputted to the second fuse enable signal generation section 120 and the fuse corresponding to the third group mat signal GMAT(1,2) is cut, the second fuse enable signal f_en2 is enabled.

Because the first fuse enable signal f_en1 is disabled, the selection unit 200 outputs the third group mat signal GMAT(1,2) and the fourth group mat signal GMAT(3,0) as the first mat information signal XMAT0 and the second mat information signal XMAT1, respectively.

As a result, since the third group mat signal GMAT(1,2) is outputted as the first mat information signal XMAT0, only the first mat information signal XMAT0 between the first mat information signal XMAT0 and the second mat information signal XMAT1 is enabled.

The enabled first mat information signal XMAT0 is inputted to the first through third fail address setting sections 310, 320 and 330. Therefore, the voltage levels of the first through third fail setting addresses F_add0 through F_add2 are determined depending upon whether the fuse corresponding to the first mat information signal XMAT0 is cut, and are then outputted.

If the voltage levels of the first through third real addresses R_add0 through R_add2 are respectively the same as the first through third fail setting addresses F_add0 through F_add2, the redundancy address RYS is generated.

As is apparent from the above descriptions, the redundancy circuit of a semiconductor memory apparatus according to the present invention can improve fuse utilization efficiency because only a fuse associated with a mat in which a memory cell failure occurs is cut.

While a certain embodiment has been described above, it will be understood to those skilled in the art that the embodiment described is by way of example only. Accordingly, the redundancy circuit of a semiconductor memory apparatus described herein should not be limited based on the described embodiment. Rather, the redundancy circuit of a semiconductor memory apparatus described herein should only be limited in light of the claims that follow when taken in conjunction with the above description and accompanying drawings.

What is claimed is:

1. A redundancy circuit of a semiconductor memory apparatus, comprising:
   an enable signal generation unit configured to have a plurality of enable fuses corresponding to a first mat grouping information signal and a second mat grouping information signal and enable an enable signal when at least one of the plurality of enable fuses is cut and a mat grouping information signal corresponding to the at least one of the plurality of enable fuses that has been cut is inputted;
   a fail address setting control block configured to select the first mat grouping information signal or the second mat grouping information signal depending on whether an enable fuse corresponding to the first mat grouping information signal is cut, and generate fail setting addresses; and
   a comparison section configured to compare the fail setting addresses with real addresses in response to the enable signal and generate a redundancy address.

2. The redundancy circuit according to claim 1, wherein the enable signal generation unit comprises:
   a first fuse enable signal generation section configured to enable a first fuse enable signal when the enable fuse corresponding to the first mat grouping information signal is cut and the first mat grouping information signal is inputted;
   a second fuse enable signal generation section configured to enable a second fuse enable signal when the enable fuse corresponding to the second mat grouping information signal is cut and the second mat grouping information signal is inputted; and
   a signal combining section configured to enable the enable signal when any one of the first fuse enable signal and the second fuse enable signal is enabled.

3. The redundancy circuit according to claim 2, wherein the fail address setting control block:
   a selection unit configured to selectively output the first mat grouping information signal and the second mat grouping information signal as mat information signals in response to the first fuse enable signal; and a fail address setting unit configured to have a plurality of setting fuses corresponding to the mat information signals and generate the fail setting addresses of specified voltage levels when at least one of the plurality of setting fuses is cut and a mat information signal corresponding to the at least one of the plurality of setting fuses that has been cut is inputted.

4. The redundancy circuit according to claim 1, wherein the comparison section is configured to generate the redundancy address at a preset voltage level when the enable signal is enabled and voltage levels of the fail setting addresses and the real addresses are the same.

5. The redundancy circuit according to claim 1,
wherein the semiconductor memory apparatus has a first mat, a second mat, a third mat, and a fourth mat, and utilizes a first group mat signal that is enabled when any one of the first mat and the second mat is activated, a second group mat signal that is enabled when any one of the third mat and the fourth mat is activated, a third group mat signal that is enabled when any one of the second mat and the third mat is activated, and a fourth group mat signal that is enabled when any one of the fourth mat and the first mat is activated, and
wherein the first mat grouping information signal comprises the first group mat signal and the second group mat signal, and the second mat grouping information signal comprises the third group mat signal and the fourth group mat signal.

6. A redundancy circuit of a semiconductor memory apparatus, comprising:
an enable signal generation unit configured to generate a first fuse enable signal when a fuse corresponding to a first mat grouping information signal is cut, generate a second fuse enable signal when a fuse corresponding to a second mat grouping information signal is cut, and generate an enable signal when any one of the first fuse enable signal and the second fuse enable signal is enabled;
a selection unit configured to selectively output the first mat grouping information signal and the second mat grouping information signal as mat information signals in response to the first fuse enable signal;
a fail address setting unit configured to generate fail setting addresses in response to the mat information signals and fuse cutting; and
a comparison section configured to compare the fail setting addresses with real addresses when the enable signal is enabled, and generate a redundancy address,
wherein each of the first fuse enable signal generation section and the second fuse enable signal generation section comprises:
a switching part configured to apply an external voltage to an output node when a reset signal is enabled; and
a plurality of fuse switching parts connected between the output node and a ground terminal, and
wherein a corresponding fuse enable signal is outputted through the output node.

7. The redundancy circuit according to claim 6,
wherein the first mat grouping information signal comprises a first signal that represents information of a first pair of grouped mats when a plurality of mats are grouped by two adjoining mats, and
wherein the second mat grouping information signal comprises a second signal that represents information of a second pair of grouped mats when the plurality of mats are grouped by two adjoining mats, the second pair of grouped mats comprising one mat of the first pair of mats of which information is represented by the first mat grouping information signal and a mat which is not grouped with the one mat.

8. The redundancy circuit according to claim 6, wherein the selection unit is configured to output the first mat grouping information signal as a first mat information signal when the first fuse enable signal is enabled, and output the second mat grouping information signal as a second mat information signal when the second fuse enable signal is enabled.

9. The redundancy circuit according to claim 7, wherein the enable signal generation unit comprises:
a first fuse enable signal generation section configured to enable the first fuse enable signal when the fuse corresponding to the first mat grouping information signal is cut;
a second fuse enable signal generation section configured to enable the second fuse enable signal when the fuse corresponding to the second mat grouping information signal is cut; and
a signal combining section configured to enable the enable signal when any one of the first fuse enable signal and the second fuse enable signal is enabled.

10. The redundancy circuit according to claim 6, wherein each of the plurality of fuse switching parts comprises:
a fuse having one terminal to which the output node is connected; and
a transistor having a gate to which a corresponding mat grouping information signal is inputted, a drain to which another terminal of the fuse is connected, and a source to which the ground terminal is connected.

11. The redundancy circuit according to claim 7, wherein the fail address setting unit is configured to generate the fail setting addresses depending upon whether a fuse corresponding to the mat information signal is cut.

12. The redundancy circuit according to claim 6, wherein the fail address setting unit comprises:
a switching part configured to apply an external voltage to an output node when a reset signal is enabled; and
a plurality of fuse switching parts connected between the output nod and a ground terminal, and
wherein the fail setting addresses are outputted through the output node.

13. The redundancy circuit according to claim 12, wherein each of the plurality of fuse switching parts comprises:
a fuse having one terminal to which the output node is connected; and
a transistor having a gate to which a corresponding mat information signal is inputted, a drain to which another terminal of the fuse is connected, and a source to which the ground terminal is connected.

14. The redundancy circuit according to claim 6, wherein the comparison section is configured to generate the redundancy address when the enable signal is enabled and values of the fail setting addresses and the real addresses are the same.

15. A redundancy circuit of a semiconductor memory apparatus, comprising:
an enable signal generation unit configured to have a first fuse and a second fuse respectively corresponding to a first group mat signal and a second group mat signal and enable a first fuse enable signal when the first fuse or the second fuse is cut and a group mat signal corresponding to the first or second fuse that has been cut is inputted, to have a third fuse and a fourth fuse respectively corresponding to a third group mat signal and a fourth group mat signal and enable a second fuse enable signal when the third fuse or the fourth fuse is cut and a group mat signal corresponding to the third or fourth fuse that has been cut is inputted, and to enable an enable signal when even any one of the first and second fuse enable signals is enabled;

a selection unit configured to selectively output the first group mat signal and the second group mat signal as a first mat information signal or the third group mat signal and the fourth group mat signal as a second mat information signal, in response to the first fuse enable signal;

a fail address setting unit configured to have a fifth fuse and a sixth fuse respectively corresponding to the first and second mat grouping information signals, and generate fail setting addresses of specified voltage levels when the fifth fuse or the sixth fuse is cut and a mat information signal corresponding to the fifth or sixth fuse that has been cut is inputted; and a comparison section configured to generate a redundancy address when the enable signal is enabled and voltage levels of the fail setting addresses and real addresses are the same.

16. The redundancy circuit according to claim 15, wherein the first group mat signal is enabled when any one of a first mat and a second mat is activated, wherein the second group mat signal is enabled when any one of a third mat and a fourth mat is activated, wherein the third group mat signal is enabled when any one of the second mat and the third mat is activated, and wherein the fourth group mat signal is enabled when any one of the fourth mat and the first mat is activated.

17. The redundancy circuit according to claim 16, wherein the fail address setting unit comprises:

a first fuse enable signal generation section comprising the first fuse and the second fuse respectively corresponding to the first and second group mat signals, and enable the first fuse enable signal when the first fuse or the second fuse is cut and a group mat signal corresponding to the first or second fuse that has been cut is inputted;

a second fuse enable signal generation section configured to have a third fuse and a fourth fuse respectively corresponding to the third and fourth group mat signals, and enable the second fuse enable signal when the third fuse or the fourth fuse is cut and a group mat signal corresponding to the third or fourth fuse that has been cut is inputted; and a signal combining section configured to enable the enable signal when any one of the first and second fuse enable signals is enabled.

18. The redundancy circuit according to claim 17, wherein the first fuse enable signal generation section comprises:

a first transistor configured to apply an external voltage to an output node when a reset signal is enabled;

the first fuse having one terminal connected to the output node;

a second fuse having one terminal connected to the output node;

a second transistor having a gate to which the first group mat signal is inputted, a drain to which the other terminal of the first fuse is connected, and a source to which a ground terminal is connected; and a third transistor having a third transistor gate to which the second group mat signal is inputted, a third transistor drain to which the other terminal of the second fuse is connected, and a third transistor source to which the ground terminal is connected.

19. The redundancy circuit according to claim 15, wherein the selection unit comprises:

a first multiplexer configured to output the first group mat signal or the third group mat signal as the first mat information signal in response to the first fuse enable signal; and a second multiplexer configured to output the second group mat signal or the fourth group mat signal as the second mat information signal in response to the first fuse enable signal.

* * * * *